United States Patent
Minami

(10) Patent No.: US 10,580,359 B2
(45) Date of Patent: Mar. 3, 2020

(54) DISPLAY DEVICE AND ELECTRONIC APPARATUS

(71) Applicant: Sony Corporation, Tokyo (JP)

(72) Inventor: Tetsuo Minami, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 16/113,391

(22) Filed: Aug. 27, 2018

(65) Prior Publication Data

US 2018/0366064 A1    Dec. 20, 2018

Related U.S. Application Data

(63) Continuation of application No. 15/301,109, filed as application No. PCT/JP2015/002304 on May 1, 2015.

(30) Foreign Application Priority Data

May 27, 2014   (JP) ................. 2014-108861

(51) Int. Cl.
   *G09G 3/3233*   (2016.01)
   *H01L 27/32*    (2006.01)
   *G09G 3/20*     (2006.01)

(52) U.S. Cl.
   CPC ......... *G09G 3/3233* (2013.01); *G09G 3/2003* (2013.01); *H01L 27/3262* (2013.01);
   (Continued)

(58) Field of Classification Search
   CPC ............... G09G 3/3233; G09G 3/2003; G09G 2300/0426; G09G 2300/0452;
   (Continued)

(56) References Cited

U.S. PATENT DOCUMENTS

2006/0262262 A1* 11/2006 Kim .................. G02F 1/134309
                                                        349/139
2008/0278648 A1   11/2008 Chang
              (Continued)

FOREIGN PATENT DOCUMENTS

CN      1869772 A    11/2006
CN    102779475 A    11/2012
              (Continued)

OTHER PUBLICATIONS

Chinese Office Action dated Aug. 2, 2018 for corresponding Chinese Application No. 2015800264074.
(Continued)

*Primary Examiner* — Ariel A Balaoing
(74) *Attorney, Agent, or Firm* — Michael Best & Friedrich LLP

(57) ABSTRACT

A display unit includes sub-pixels that each have a light emitting element, a capacitor, a first transistor that writes a video signal potential to the capacitor, and a second transistor that provides a drive current to the light emitting element based on a voltage stored in the capacitor. Each first transistor has a channel width W and channel length L, such that a width to length ratio is W/L. The width to length ratio $W_1/L_1$ of one of the first transistors is different than a width-to-length ratio $W_2/L_2$ of at least one other of the first transistors.

22 Claims, 10 Drawing Sheets

(52) U.S. Cl.
CPC .............. *G09G 2300/0426* (2013.01); *G09G 2300/0452* (2013.01); *G09G 2300/0866* (2013.01); *G09G 2320/0209* (2013.01); *G09G 2320/0219* (2013.01); *G09G 2320/0223* (2013.01); *G09G 2320/0233* (2013.01); *G09G 2320/043* (2013.01); *G09G 2330/025* (2013.01)

(58) Field of Classification Search
CPC ... G09G 2320/0233; G09G 2320/0209; G09G 2320/025
See application file for complete search history.

(56) References Cited

U.S. PATENT DOCUMENTS

| | | |
|---|---|---|
| 2010/0033476 A1 | 2/2010 | Yamamoto et al. |
| 2011/0267327 A1 | 11/2011 | Hwang |
| 2012/0050346 A1 | 3/2012 | Sung et al. |
| 2012/0287092 A1* | 11/2012 | Tatara ................. G09G 3/3233 345/204 |
| 2015/0138054 A1 | 5/2015 | Nakamura |

FOREIGN PATENT DOCUMENTS

| | | |
|---|---|---|
| JP | 2007-310311 A | 11/2007 |
| JP | 2008-176141 A | 7/2008 |
| JP | 2009-122231 A | 6/2009 |
| JP | 2010-002530 A | 1/2010 |
| JP | 2010-002676 A | 1/2010 |
| JP | 2010-097050 A | 4/2010 |
| JP | 2012-237806 A | 12/2012 |

OTHER PUBLICATIONS

Japanese Office Action dated Dec. 12, 2017, for corresponding Japanese Application No. 2014-108861.

* cited by examiner

_US 10,580,359 B2_

DISPLAY DEVICE AND ELECTRONIC APPARATUS

CROSS REFERENCE TO RELATED APPLICATIONS

This application is a Continuation of application Ser. No. 15/301,109, filed Sep. 30, 2016, which is a National Stage Application of PCT/JP2015/002304, filed May 1, 2015, and claims the benefit of Japanese Priority Patent Application JP 2014-108861 filed May 27, 2014, the entire contents of which are incorporated herein by reference.

TECHNICAL FIELD

The present disclosure relates to a display device and an electronic apparatus, and particularly to a flat panel type display device and an electronic apparatus including the display device.

BACKGROUND ART

As a flat panel type display device (flat display), a liquid crystal display device (LCD), an organic electro luminescence (EL) display device, or the like is known. In addition, as one of drive methods of the flat panel type display device, there is an active matrix method. In a display device of the active matrix method (type), a unit pixel (hereinafter, may be simply referred to as "pixel") including a light emitting unit (light emitting element) includes at least a writing transistor that writes a signal (for example, PTL 1).

CITATION LIST

Patent Literature

[PTL 1]
Japanese Unexamined Patent Application Publication No. 2007-310311

SUMMARY

Technical Problem

However, in a display device of an active matrix method, for example, when a pattern of high brightness is partially displayed in a gray area, brightness of a gray pixel on a line (pixel row) including a pattern of high brightness is higher than brightness of a gray pixel other than that (gray area). This is because a large current instantaneously flows at the time of signal writing to a power supplying line which supplies a pixel with a current, when there are many pixels of high brightness light emission in pixels on the same line. Accordingly, a gray pixel on a line including a pattern of high brightness is brighter than a gray pixel of a gray area, and thus it can be viewed as crosstalk.

It is desirable to provide a display device which can reduce crosstalk caused by a current instantaneously flowing through a power supplying line at the time of signal writing, and to provide an electronic apparatus including the display device.

Solution to Problem

The present disclosure provides various exemplary embodiments that solve at least the above-noted problems. One exemplary embodiment of the present disclosure includes a display unit comprising: a plurality of sub-pixels, each including a light emitting element, a capacitor, a first transistor configured to write a signal potential to the capacitor, and a second transistor configured to provide a drive current to the light emitting element based on a voltage stored in the capacitor. The first transistor of each of the plurality of sub-pixels may have a width-to-length ratio W/L, and a width to length ratio $W_1/L_1$ of a first sub-pixel of the plurality of sub-pixels may be different than a width-to-length ratio $W_2/L_2$ of a second sub-pixel of the plurality of sub-pixels.

Another exemplary embodiment of the present disclosure includes an electronic apparatus comprising a display unit comprising: a plurality of sub-pixels, each including a light emitting element, a capacitor, a first transistor configured to write a signal potential to the capacitor, and a second transistor configured to provide a drive current to the light emitting element based on a voltage stored in the capacitor. The first transistor of each of the plurality of sub-pixels may have a width-to-length ratio W/L, and a width to length ratio $W_1/L_1$ of a first sub-pixel of the plurality of sub-pixels may be different than a width-to-length ratio $W_2/L_2$ of a second sub-pixel of the plurality of sub-pixels.

Advantageous Effects of Invention

According to the embodiment of the present disclosure, since a current instantaneously flowing through the power supplying line at the time of signal writing can be reduced, it is possible to reduce crosstalk caused by the instantaneous current. Meanwhile, the present disclosure is not limited to the effects described herein, and may have anyone of the effects described in the present specification. In addition, the effects described in the present specification are simply examples, and the present disclosure is not limited to this, and in addition, may have an additional effect.

DESCRIPTION OF EMBODIMENTS

Figure 1:
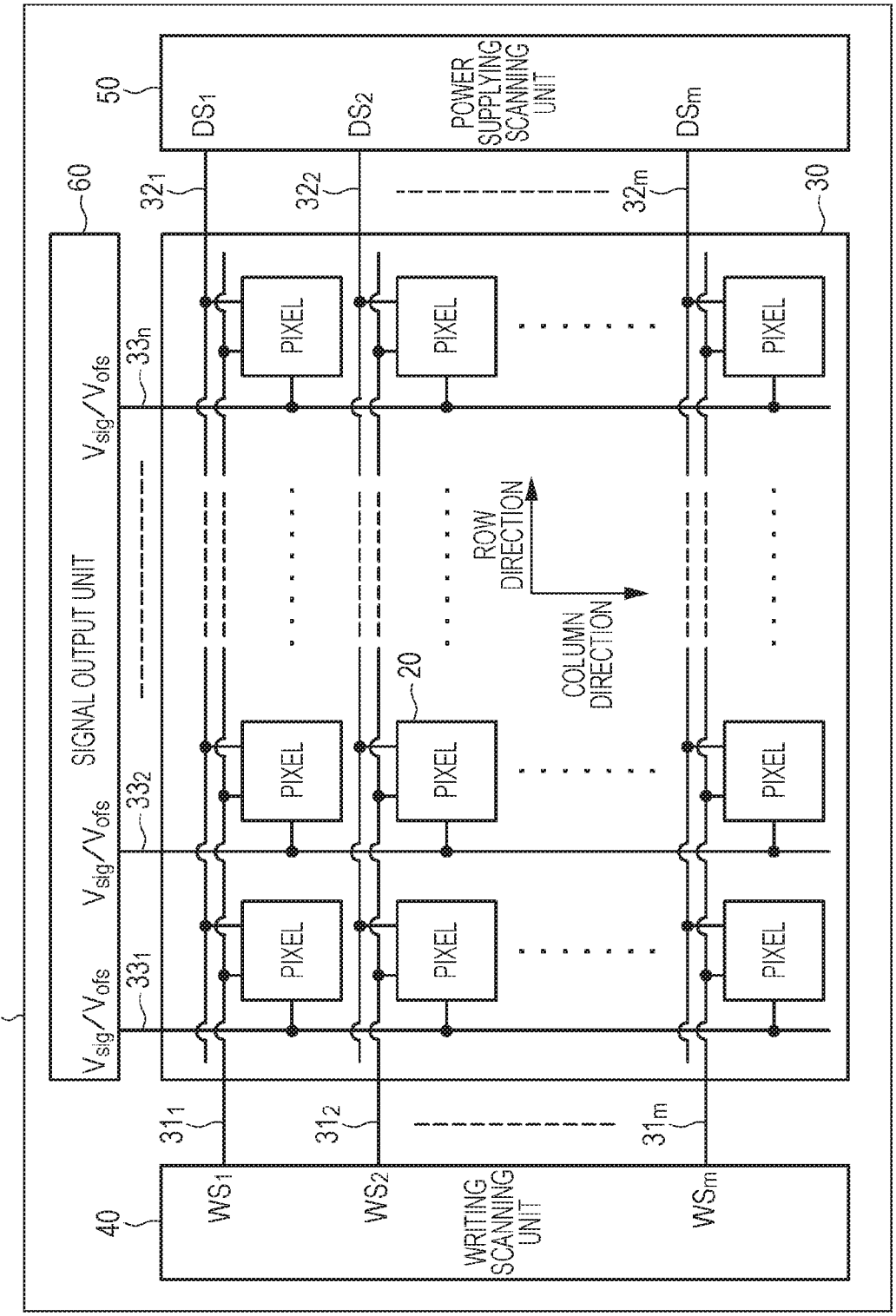
FIG. 1 is a system configuration diagram schematically illustrating a basic configuration of an active matrix type display device to which a technology of the present disclosure is applied.

Hereinafter, forms (hereinafter, referred to as "embodiment") for performing a technology of the present disclosure will be described in details with reference to the drawings. The technology of the present disclosure is not limited to the embodiments, various numerical values or the like of the embodiments are exemplified. In the following description, the same symbols or reference numerals will be attached to the same elements or elements having the same function, and repeated description will be omitted. Meanwhile, the description will be made in the following sequence.
1. Total Description with regard to Display Device and Electronic Apparatus of Present Disclosure
2. Display Device to which Technology of Present Disclosure is Applied
2-1. System Configuration
2-2. Pixel Circuit
2-3. With regard to Crosstalk due to Instantaneous Current at the time of Signal Writing
3. Description of Embodiment
3-1. Example 1 [Example of Vertical Stripe Arrangement of RGB of Color Arrangement of Sub-pixel]
3-2. Example 2 [Example of Character Arrangement of Field of RGBW of Color Arrangement of Sub-pixel]
4. Modification Example
5. Electronic Apparatus (Example of Television Set)
<Total Description with Regard to Display Device and Electronic Apparatus of Present Disclosure>

In a display device and an electronic apparatus, when a unit pixel is configured by sub-pixels with a plurality of colors, a color unit of the sub-pixel can be differently configured, with regard to a size of a writing transistor connected to one scanning line in each unit pixel.

In the display device and the electronic apparatus according to the present disclosure which include a desirable configuration described above, when a unit pixel is configured by sub-pixels with a plurality of colors, a color unit of the sub-pixel can be differently configured, with regard to a size of a writing transistor connected to one scanning line in each unit pixel. In addition, a size of a writing transistor of a sub-pixel of each color that configures a unit pixel can be configured to be set to sizes different from each other in correspondence to a current value which is necessary at the time of signal writing.

In addition, in the display device and the electronic apparatus according to the present disclosure, which include a desirable configuration described above, a size of a writing transistor in a sub-pixel of each color that configures a unit pixel, can be configured to be set such that a size is increased in a sequence that a current value necessary at the time of signal writing is decreased. In addition, even when the unit pixel has a red sub-pixel, a green sub-pixel, and a blue sub-pixel in addition to a white sub-pixel, sizes of the writing transistor of each sub-pixel can be configured to be set so as to be increased in a sequence of the white sub-pixel, the red sub-pixel, the green sub-pixel, and the blue sub-pixel.

Alternatively, in the display device and the electronic apparatus according to the present disclosure which include a desirable configuration described above, when the unit pixel includes a drive transistor that drives a light emitting unit based on a signal that is written by the writing transistor, the unit pixel is configured to have a correction function to correct variation of a drive current caused by variation of characteristics of the drive transistor. The correction function can be configured to correct variation of a drive current caused by variation of a threshold voltage of the drive transistor. In addition, the correction function can be configured to correct variation of a drive current caused by variation of mobility of a semiconductor thin film that configures a channel of the drive transistor.

In addition, in the display device and the electronic apparatus according to the present disclosure which include a desirable configuration described above, a light emitting unit of a unit pixel can be configured with a current drive type electro-optical element, for example, an organic electro luminescence (EL) element. The organic EL element is a self light emitting type electro-optical element (light emitting element) that uses electroluminescence of an inorganic material, and uses a phenomenon in which light is emitted if an electric field is applied to an organic thin film. As a current drive type electro-optical element, an inorganic EL element, an LED element, a semiconductor laser element, or the like can be used in addition to an organic EL element.

An organic EL element has a configuration in which an organic layer is formed by sequentially depositing a hole transport layer, alight emitting layer, an electron transport layer, and an electron injection layer on a first electrode (for example, anode), and a second electrode (for example, cathode) is formed on the organic layer. Then, by applying a DC voltage between the first electrode and the second electrode, holes are injected into the light emitting layer via the hole transport layer from the first electrode (anode), electrons are injected into the light emitting layer via the electron transport layer from the second electrode (cathode), and light is emitted when the electrons and the holes are recombined in the light emitting layer.

An organic EL display device that uses an organic EL element as a light emitting unit of a pixel has the following characteristics. That is, since the organic EL element can be driven by an application voltage equal to or less than 10 V, the organic EL display device consumes a low power. Since the organic EL element is a self light emitting type element, the organic EL display device has high visibility of an image, compared to a liquid crystal display device which is the same flat type display device, and furthermore, since an illumination member such as a backlight is not necessary, it is easy to reduce weight and to make thin. Furthermore, since a response speed of an organic EL element is very fast as a few microseconds, afterimage at the time of displaying a moving image does not occur in the organic EL display device.

<Display Device to which Technology of Present Disclosure is Applied>
(System Configuration)

FIG. 1 is a system configuration diagram schematically illustrating a basic configuration of an active matrix type display device (display device of the present disclosure) to which a technology of the present disclosure is applied.

The active matrix type display device is a display device in which an operation of a light emitting unit (light emitting element) is performed by an active element that is provided in a pixel which is the same as the light emitting unit, for example, insulating gate type field effect transistor. A thin film transistor (TFT) is typically used as the insulating gate type field effect transistor.

Here, as an example, an active matrix type organic EL display device which uses an organic EL element as a light emitting unit (light emitting element) of a unit pixel (pixel circuit) will be described. The organic EL element is a current drive type electro-optical element in which light emission brightness is changed depending on a current value flowing through a device. Hereinafter, a "unit pixel/pixel circuit" may also be simply referred to as a "pixel". A thin film transistor is used for controlling a peripheral circuit which will be described later, in addition to being used for controlling a pixel.

As illustrated in FIG. 1, an organic EL display device 10 to which a technology of the present disclosure is applied, is configured to include a pixel array unit 30 in which a plurality of unit pixels 20 are two-dimensionally arranged in a matrix, and a drive unit (periphery) which is disposed in a peripheral area of the pixel array unit 30 and drives the pixels 20. The drive unit is configured with, for example, a writing scanning unit 40, a power supplying scanning unit 50, a signal output unit 60, and the like, and drives each pixel 20 of the pixel array unit 30.

In the present example, the writing scanning unit 40, the power supplying scanning unit 50, and the signal output unit 60 are mounted on the same substrate as the pixel array unit 30, that is, on a display panel 70. However, it is also possible to adopt a configuration in which some or all of the writing scanning unit 40, the power supplying scanning unit 50, and the signal output unit 60 are provided in a member other than the display panel 70. In addition, the writing scanning unit 40 and the power supplying scanning unit 50 are respectively disposed in one side of the pixel array unit 30, but it is also possible to adopt a configuration in which the writing scanning unit 40 and the power supplying scanning unit 50 are disposed in both sides of the pixel array unit 30 which is interposed therebetween. As a substrate of the display panel 70, a transparent insulating substrate such as a glass substrate can also be used, and a semiconductor substrate such as a silicon substrate can also be used.

Here, when the organic EL display device 10 performs a color display, one pixel (unit pixel/pixel) that is a unit forming a color image is configured by sub-pixels of a plurality of colors. At this time, each sub-pixel corresponds to the pixel 20 of FIG. 1. More specifically, in a display device that performs a color display, for example, one pixel is configured by three sub-pixels of a sub-pixel that emits red (R) light, a sub-pixel that emits green (G) light, and a sub-pixel that emits blue (B) light.

However, the one pixel is not the limited to a combination of sub-pixels with three original colors of RGB, and it is also possible to configure the one pixel by adding a sub-pixel of one color or sub-pixels of a plurality of colors to the sub-pixels with three original colors. More specifically, for example, it is also possible to configure the one pixel by adding a sub-pixel that emits white (W) light for increasing brightness, or to configure the one pixel by adding at least one sub-pixel that emits complementary color light for expanding a color reproduction range.

In the pixel array unit 30, scanning lines 31 ($31_1$ to $31_m$) and power supplying lines 32 ($32_1$ to $32_m$) are arranged in each pixel row in a row direction (arrangement direction of pixel of pixel row/horizontal direction), with respect to an arrangement of m rows and n columns of pixels 20. Furthermore, signal lines 33 ($33_1$ to $33_n$) are arranged in each pixel column in a column direction (arrangement direction of pixel of pixel column/vertical direction), with respect to an arrangement of m rows and n columns of pixels 20.

The scanning lines $31_1$ to $31_m$ are respectively connected to output terminals of corresponding rows of the writing scanning unit 40. The power supplying lines $32_1$ to $32_m$ are respectively connected to output terminals of corresponding rows of the power supplying scanning unit 50. The signal lines $33_1$ to $33_n$ are respectively connected to output terminals of corresponding columns of the signal output unit 60.

The writing scanning unit 40 is configured by a shift register circuit and the like. When a signal voltage of a video signal is written to each pixel 20 of the pixel array unit 30, the writing scanning unit 40 sequentially supplies writing scanning signals WS ($WS_1$ to $WS_m$) to the scanning lines 31 ($31_1$ o $31_m$), thereby sequentially scanning each pixel 20 of the pixel array unit 30 by a row unit, that is, performing so-called line sequential scanning.

The power supplying scanning unit 50 is configured by a shift register circuit and the like, in the same manner as the writing scanning unit 40. The power supplying scanning unit 50 supplies power supplying lines 32 ($32_1$ to $32_m$) with power supply voltages DS ($DS_1$ to $DS_m$) that can be switched by a first power supply voltage $V_{ccp}$ and a second power supply voltage $V_{ini}$ lower than the first power supply voltage $V_{ccp}$, in synchronization with the line sequential scanning performed by the writing scanning unit 40. As will be described later, a control of light emission/non-light-emission (light off) of the pixel 20 is performed by switching $V_{ccp}/V_{ini}$ of the power supply voltage DS.

The signal output unit 60 selectively outputs a signal voltage (hereinafter, may be simply referred to as "signal voltage") $V_{sig}$ of a video signal, which is supplied from a signal supply source (not illustrated), according to brightness information, and a reference voltage $V_{ofs}$. Here, the reference voltage $V_{ofs}$ is a voltage (for example, voltage corresponding to a black level of video signal) that serves as a reference of the signal voltage $V_{sig}$ of the video signal, and is used at the time of threshold correction processing that will be described later.

The signal voltage $V_{sig}$ and the reference voltage $V_{ofs}$ that are output from the signal output unit 60 are written to each pixel 20 of the pixel array unit 30 via the signal lines 33 ($33_1$ to $33_n$) by a unit of pixel row that is selected by scanning performed by the writing scanning circuit 40. That is, the signal output unit 60 adopts a drive form of line sequential writing which writes the signal voltage $V_{sig}$ by a row (line) unit.

(Pixel Circuit)

Figure 2:
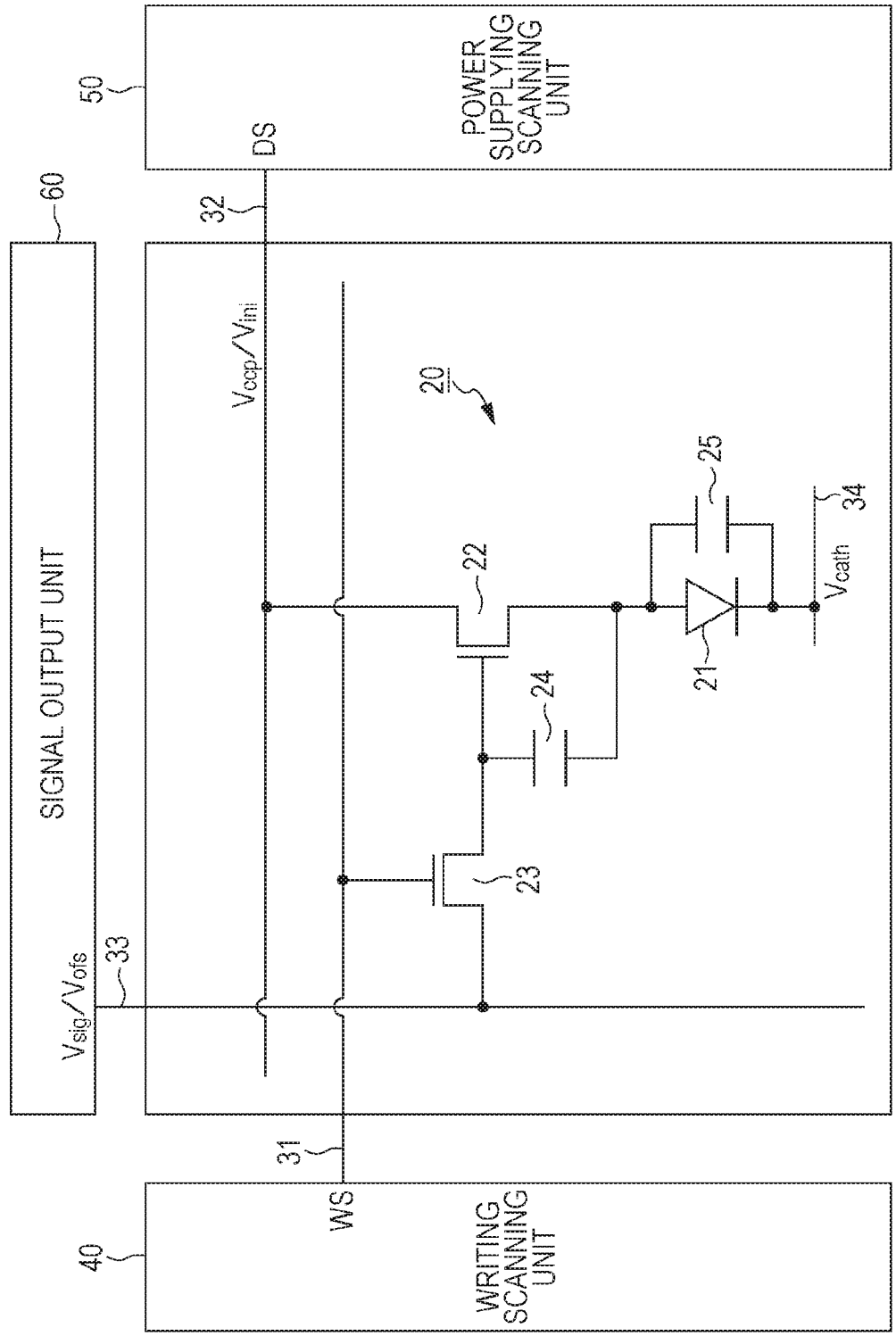
FIG. 2 is a circuit diagram illustrating an example of a specific circuit configuration of a unit pixel (pixel circuit).

FIG. 2 is a circuit diagram illustrating an example of a specific circuit configuration of the unit pixel (pixel circuit) 20. A light emitting unit of the pixel 20 is configured with an organic EL element 21 that is an example of a current drive type electro-optical element in which light emission brightness is changed depending on a current value flowing through a device.

As illustrated in FIG. 2, the pixel 20 is configured with an organic EL element 21, and a drive circuit that drives the organic EL element 21 by making a current flow through the organic EL element 21. The organic EL element 21 has a cathode electrode that is connected to a common power supply line 34 which is disposed in all pixels 20.

The drive circuit that drives the organic EL element 21 has a circuit configuration of 2Tr2C which includes a drive transistor 22, a writing transistor 23, a storage capacitor 24, and an auxiliary capacitor 25, that is, two transistors (Tr) and two capacitance elements (C). Here, the drive transistor 22 and the writing transistor 23 use an N channel type thin film transistor (TFT). However, as illustrated here, a conductive combination of the drive transistor 22 and the writing transistor 23 is just an example, and the present disclosure is not limited to this combination.

The drive transistor 22 has one electrode (source or drain electrode) connected to the power supplying lines 32 ($32_1$ to $32_m$) and has another electrode (source or drain electrode) connected to an anode electrode of the organic EL element 21. The writing transistor 23 has one electrode (source or drain electrode) connected to the signal lines 33 ($33_1$ to $33_n$) and has another electrode (source or drain electrode) connected to a gate electrode of the drive transistor 22. In addition, a gate electrode of the writing transistor 23 is connected to the scanning lines 31 ($31_1$ to $31_m$).

In the drive transistor 22 and the writing transistor 23, the one electrode indicates a metal wire that is electrically connected to one of the source region and the drain region, and another electrode indicates a metal wire that is electrically connected to the other region of the source region and the drain region. In addition, by a potential relationship between the one electrode and another electrode, if becoming a source electrode, one electrode becomes a drain electrode, and if becoming a drain electrode, another electrode becomes source electrode.

The storage capacitor 24 has one electrode connected to the gate electrode of the drive transistor 22, and has the other electrode connected to another electrode of the drive transistor 22 and the anode electrode of the organic EL element 21. The auxiliary capacitor 25 has one electrode connected to the anode electrode of the organic EL element 21, and has the other electrode connected to a cathode electrode of the organic EL element 21. That is, the storage capacitor 24 is connected in parallel to the organic EL element 21.

In the configuration described above, the writing transistor 23 is turned on according to a writing scanning signal WS in which a state of a high voltage that is applied from the writing scanning unit 40 to the gate electrode via the scanning line 31 becomes an active state. Accordingly, the writing transistor 23 samples the signal voltage $V_{sig}$ of a video signal according to brightness information that is supplied from the signal output unit 60 via the signal lines 33 at a different timing, or the reference voltage $V_{ofs}$, and writes the voltage to the pixel 20. The signal voltage $V_{sig}$ or the reference voltage $V_{ofs}$ that is written by the writing transistor 23 is stored in the storage capacitor 24.

When the power supply voltage DS of the power supplying line 32 ($32_1$ to $32_m$) is the first power supply voltage $V_{ccp}$, one electrode becomes a drain electrode, and another electrode becomes a source electrode, and thus the drive transistor 22 operates in a saturation region. Accordingly, the drive transistor 22 receives a current from the power supplying line 32, drives the organic EL element 21 using the current, and thereby the organic EL element 21 emits light. More specifically, the drive transistor 22 operates in a saturation region, and supplies the organic EL element 21 with a drive current with a current value according to a voltage value of the signal voltage $V_{sig}$ stored in the storage capacitor 24, and the organic EL element is driven by a current, thus, emitting light.

Furthermore, when the power supply voltage DS is switched to the second power supply voltage $V_{ini}$ from the first power supply voltage $V_{ccp}$, one electrode becomes a source electrode, and another electrode becomes a drain electrode, and thus the drive transistor 22 operates as a switching transistor. Accordingly, the drive transistor 22 does not supply a drive current to the organic EL element 21 thereby the organic EL element 21 is in a non-light-emission state. That is, the drive transistor 22 also has a function as a transistor that controls light emission and not-light-emission of the organic EL element 21.

By the switching operation of the drive transistor 22, a time period in which the organic EL element 21 is in a non-light-emission state (non-light-emission period) is provided, and a ratio (duty) of a light emission period to a non-light-emission period of the organic EL element 21 can be controlled. Since afterimage blur according to light emission of a pixel over one display frame period can be reduced by this duty control, it is possible to further increase picture quality of a moving image.

The first power supply voltage $V_{ccp}$ of the first and second power supply voltages $V_{ccp}$ and $V_{ini}$ that are selectively supplied from the power supplying scanning unit 50 via the power supplying line 32, is a power supply voltage for supplying the drive transistor 22 with a drive current which drives the organic EL element 21 so as to emit light. The second power supply voltage $V_{ini}$ is a power supply voltage for applying a reverse bias to the organic EL element 21. The second power supply voltage $V_{ini}$ is set to a voltage that is lower than the reference voltage $V_{ofs}$, for example, a voltage that is lower than ($V_{ofs}-V_{th}$) when a threshold voltage of the drive transistor 22 is referred to as $V_{th}$, and desirably, a voltage that is sufficiently lower than ($V_{ofs}-V_{th}$).

Each pixel 20 of the pixel array unit 30 has a function to correct variation of a drive current caused by variation of characteristics of the drive transistor 22. As the characteristics of the drive transistor 22, for example, the threshold voltage $V_{th}$ of the drive transistor 22, or mobility u (hereinafter, simply referred to as "mobility u of the drive transistor 22") of a semiconductor fin film that configures a channel of the drive transistor 22 can be used.

Correction (hereinafter, may be referred to as "threshold correction") of variation of the drive current caused by the variation of the threshold voltage $V_{th}$ can be performed by initializing a gate potential $V_g$ of the drive transistor 22 to the reference voltage $V_{ofs}$. Specifically, an operation of changing a source potential $V_s$ of the drive transistor 22 is performed toward a potential that is obtained by decreasing he threshold voltage $V_{th}$ of the drive transistor 22 from the initialization voltage by using the initialization voltage (reference voltage $V_{ofs}$) of the gate potential $V_g$ of the drive transistor 22 as a reference. If this operation is performed, soon, a source-gate voltage $v_{gs}$ of the drive transistor 22 is converged to the threshold voltage $V_{th}$ of the drive transistor 22. A voltage corresponding to the threshold voltage $V_{th}$ is stored in the storage capacitor 24. Then, since a voltage corresponding to the threshold voltage $V_{th}$ is stored in the storage capacitor 24, it is possible to reduce dependency with respect to the threshold voltage $V_{th}$ of a drain-source current $I_{ds}$ flowing through the drive transistor 22, when the drive transistor 22 is driven by the signal voltage $V_{sig}$ of a video signal.

Meanwhile, correction (hereinafter, may be referred to as "mobility correction") of variation of a drive current caused by variation of mobility u, is performed by making a current flow into the storage capacitor 24 via the drive transistor 22, in a state where the writing transistor 23 is turned on and the signal voltage $V_{sig}$ of the video signal is written. In other words, the correction is performed by performing negative feedback to the storage capacitor 24 with an amount of feedback (amount of correction) according to the current $I_{ds}$ flowing through the drive transistor 22. When the video signal is written, the dependency with respect to the threshold voltage $V_{th}$ of the drain-source current $I_{ds}$ is cancelled in advance by the threshold correction, and the drain-source current $I_{ds}$ depends on the mobility u of the drive transistor 22. Thus, the negative feedback is performed to the drain-source voltage $V_{ds}$ of the drive transistor 22 by the amount of feedback according to the current $I_{ds}$ flowing through the drive transistor 22, and thus it is possible to suppress the dependency with respect to the mobility u of the drain-source current $I_{ds}$ flowing through the drive transistor 22.

Figure 3:
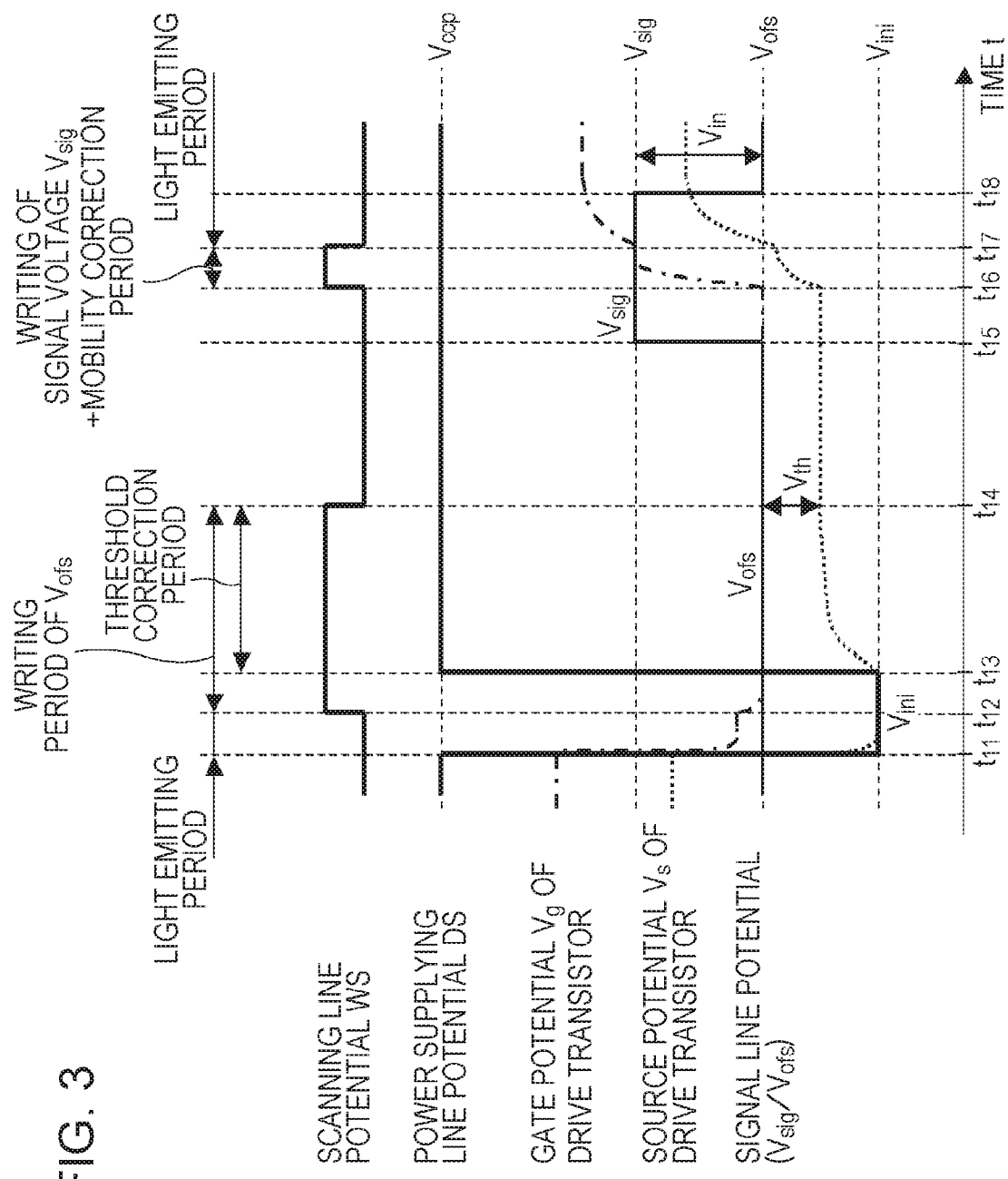
FIG. 3 is a timing waveform diagram illustrating a basic circuit operation of an organic EL display device to which a technology of the present disclosure is applied.

FIG. 3 is a timing waveform diagram illustrating a basic circuit operation of the organic EL display device 10 to which a technology of the present disclosure is applied. The timing waveform of FIG. 3 illustrates a change of each of a voltage (writing scanning signal) WS of the scanning line 31, a voltage (power supply voltage) DS of the power supplying line 32, a voltage ($V_{sig}/V_{ofs}$) of the signal line 33, and the source potential $V_s$ and the gate potential $V_g$ of the drive transistor 22. Here, a switching period of a voltage of the signal line 33, that is, a switching period of the signal voltage $V_{sig}$ of the video signal and the reference voltage $V_{ofs}$ becomes one horizontal period (1H).

Meanwhile, since the writing transistor 23 has an N channel type, a stat of a high voltage of the writing scanning signal WS becomes an active state, and a state of a low voltage becomes an inactive state. Then, the writing transistor 23 is turned on in a state where the writing scanning signal WS is active, and is turned off in a state where the writing scanning signal WS is inactive.

In the timing waveform of FIG. 3, a period before time $t_{11}$ is a light emission period of the organic EL element 21 of previous display frame, and when reaching time $t_{11}$, the signal enters a non-light-emission period of a new display frame (current display frame) of line sequential scan. Then, a time period from time $t_{12}$ to time $t_{14}$ when the writing scanning signal WS enters an active state, becomes a writing period in which the writing transistor 23 writes the reference voltage $V_{ofs}$ to the pixel 20, and a period from time $t_{13}$ to time $t_{14}$ becomes a threshold correction period in which the variation of the drive current caused by the variation of the threshold voltage $V_{th}$ of the drive transistor 22 is corrected.

In addition, in the period from time $t_{15}$ to time $t_{18}$, a voltage of the signal line 33 becomes the signal voltage $V_{sig}$ of a video signal. Then, in a period from time $t_{16}$ to time $t_{17}$, the writing scanning signal WS enters an active state again, and thus the writing transistor 23 is turned on. Accordingly, the signal voltage $V_{sig}$ of a video signal is written to the pixel 20 by the writing transistor 23, and mobility correction processing of correcting the variation of the drive current caused by the variation of the mobility u of the drive transistor 22 is performed. That is, the period from the time $t_{16}$ to time $t_{17}$ becomes (writing of the signal voltage $V_{sig}$+ mobility correction period). Then, when reaching the time $t_{17}$, the signal enters a light emission period of the current display frame.

(With Regard to Crosstalk Due to Instantaneous Current at the Time of Signal Writing)

Figure 4A:
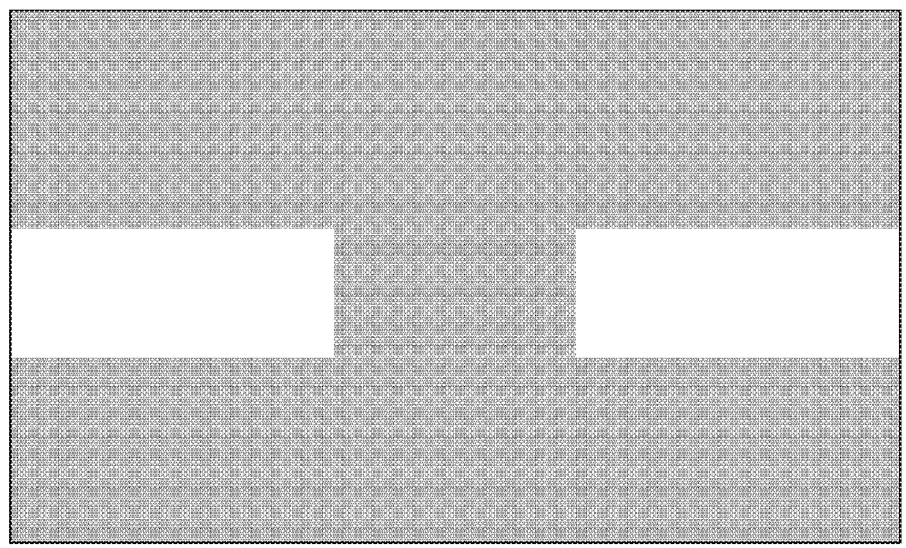
FIG. 4A is a view illustrating a mechanism that is visually recognized as cross-talk, and particularly illustrates a display pattern example.

Next, crosstalk will be described, which occurs due to a large current that instantaneously flows through the power supplying line 32 when the signal voltage $V_{sig}$ is written by the writing transistor 23. Here, as illustrated in FIG. 4A, for example, a case where a pattern (WINDOW) of high brightness is partially displayed on a gray area will be described.

Figure 4B:
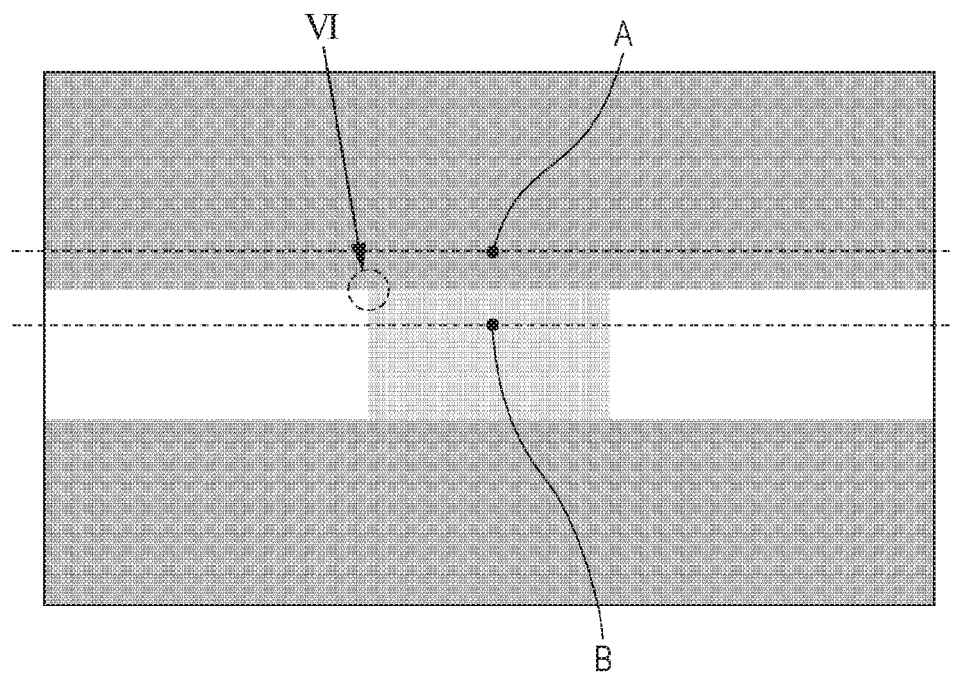
FIG. 4B is a view illustrating a mechanism that is visually recognized as cross-talk, and particularly illustrates an image in which the cross-talk occurs.

When a pattern of high brightness is partially displayed on a gray area, as illustrated in FIG. 4B, brightness of a gray pixel (point B in the figure) on a line (pixel row) including a pattern of high brightness is higher than brightness of a gray pixel (point A in the figure) other than that (gray area). Accordingly, a gray pixel of the point B of a pattern of high brightness is brighter than the gray pixel of the pint A of the gray area, and thus it is viewed as crosstalk.

Figure 5:
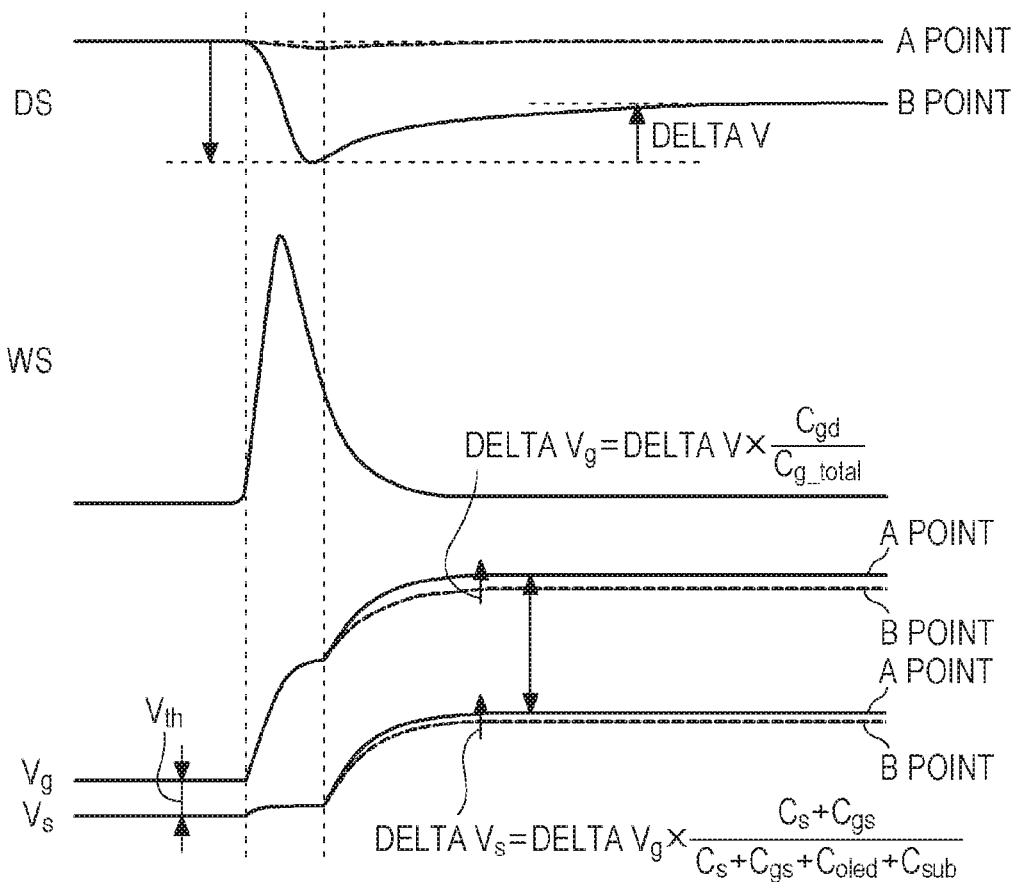
FIG. 5 is a waveform diagram illustrating drive waveforms at the time of signal writing performed by a writing transistor.

Here, a mechanism being viewed as crosstalk will be described using the waveform diagram of FIG. 5. FIG. 5 is a waveform diagram illustrating drive waveforms at the time of signal writing performed by the writing transistor 23. In FIG. 5, waveforms at the time of signal writing of the power supply voltage DS, the writing scanning signal WS, and the gate potential $V_g$ and source potential $V_s$ of the drive transistor 22 are illustrated.

Figure 6:
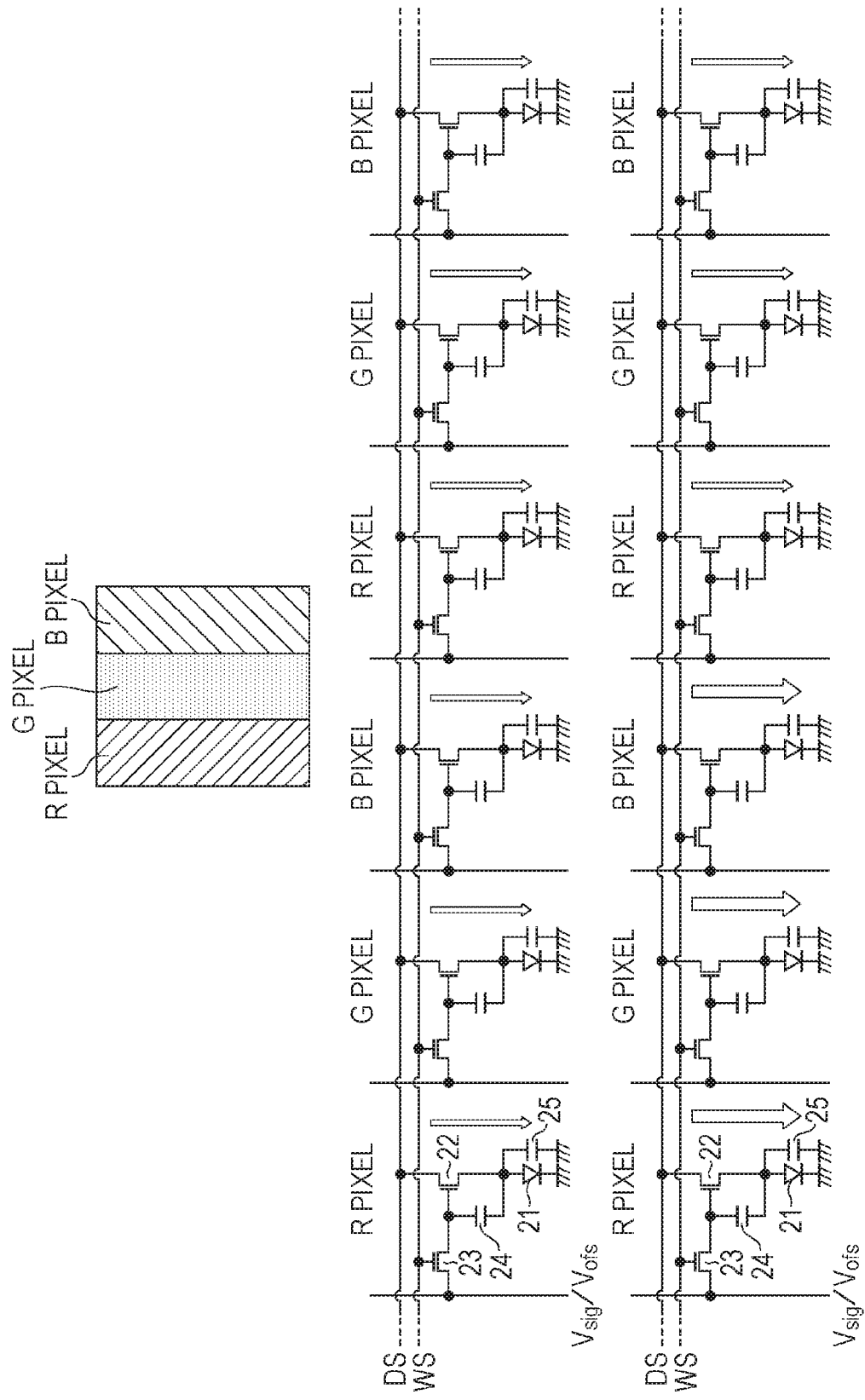
FIG. 6 is a diagram illustrating an image of a current flowing through a drive transistor when cross talk occurs.

In addition, FIG. 6 illustrates an image of a current flowing through the drive transistor 22 when crosstalk occurs. FIG. 6 illustrates an image with regard to an area that is surrounded by O (VI) of dotted line, that is, an interface portion of a gray area, a pattern (WINDOW) of high brightness, and crosstalk portion, in FIG. 4B. In addition, in FIG. 6, a thick arrow indicates a state where a current is relatively large, and a thin arrow indicates a state where a current is relatively small. Here, as an example, a case where a red (R) sub-pixel, a green (G) sub-pixel, and a blue (B) sub-pixel are arranged in a vertical stripe manner is illustrated.

When the writing scanning signal WS for signal writing is applied to the writing transistor 23, mobility correction is started, and thereby a current flows through the drive transistor 22. This current is supplied from the power supplying line 32, but timings when the writing scanning signal WS is applied to all pixels in which the drive transistors 22 are connected to the power supplying line 32 are the same, and thus currents simultaneously flow through each pixel. Then, when there are many pixels of high brightness light emission among the pixels connected to the same power supplying line 32, a large current instantaneously flows through the power supplying line 32, and according to this, a voltage of the power supplying line 32, that is, a voltage drop occurs in the power supply voltage DS. The voltage drop is determined by a current flowing through the power supplying line 32 and a wiring resistance of the power supplying line 32.

Accordingly, when a gray pixel of the point A and a gray pixel of the point B in FIG. 4B are compared to each other, there is a pixel through which a large current with high brightness flows, among the pixels on the line (pixel row) including gray pixels of the point B, and thus a voltage drop of the power supplying line 32 at the time of signal writing performed by the writing transistor 23 is larger in the gray pixel of the point A than in the gray pixel of the point B. Since the power supplying line 32 is connected to a power supply, the temporary voltage drop is gradually recovered, and rises up to ($V_{ccp}$–(voltage drop of current flowing at the time of normal light emission).

If the writing scanning signal WS enters an inactive state and the writing transistor 23 is turned off, a gate node of the drive transistor 22 is floated. For this reason, if a potential of the power supplying line 32 connected to the drain electrode of the drive transistor 22 increases, the gate potential $V_g$ of the drive transistor 22 also increases via a gate-drain capacitance $C_{gd}$ of the drive transistor 22.

After entering an inactive state, and until the writing scanning signal WS enters a light emission normal state, and when the potential of the power supplying line 32 increases by delta V, an amount of change delta $V_g$ of the gate potential $V_g$ of the drive transistor 22 is represented by the following equation. delta $V_g$=delta $V*C_{gs}/C_{g\_total}$ Here, $C_{g\_total}$ is a total sum of all capacitances that are connected (viewed from the gate node) to the gate node of the drive transistor 22. Specifically, if a capacitance of the storage capacitor 24 is referred to as $C_s$, a capacitance between the gate and source of the drive transistor 22 is referred to as $C_{gs}$, an equivalent capacitance of the organic EL element 21 is referred to as $C_{oled}$, a capacitance of the auxiliary capacitor 25 is referred to as $C_{sub}$, a capacitance between the gate-source and the drain of the writing transistor 23 is referred to as $C_{ws}$, and a capacitance between the gate and the drain of the drive transistor 22 is referred to as $C_{gd}$, $C_{g\_total}$ is represented by the following equation.

$$C_{g\_total}=\{(C_s+C_{gs})/(C_{sub}+C_{oled})/(C_s+C_{gs}+C_{oled}+C_{sub})\}+C_{ws}+C_{gd}$$

If the gate potential $V_g$ of the drive transistor 22 increases by delta $V_g$, the source potential $V_s$ of the drive transistor 22 increases by the following equation.

$$\text{delta } V_s=\text{delta } V_g(C_s+C_{gd})/(C_s+C_{gs}+C_{oled}+C_{sub})$$

If the gate potential $V_g$ of the drive transistor 22 increases and according to this, the source potential $V_s$ of the drive transistor 22 also increases, an amount of change delta $V_{gs}$ of the gate-source voltage $V_{gs}$ of the drive transistor 22 is represented by the following equation.

$$\text{delta } V_{gs}=\text{delta } V_g-\text{delta } V_s$$

Here, if there is almost no drop in a potential of the power supplying line 32 connected to the gray pixel of the point A, the gate-source voltage $V_{gs}$ of the drive transistor 22 increases by an amount of change delta $V_{gs}$ of the gate-source voltage $V_{gs}$ of the drive transistor 22, and the drive current $I_{ds}$ also increases. Thus, the more the drive current $I_{ds}$ increases, the higher the brightness becomes. Thus, since the gray pixel of the point B has high brightness compared to the gray pixel of the point A, it is viewed as crosstalk, and causes deterioration of uniformity (uniformity of screen). A crosstalk rate is determined by a ratio of the gate-source voltages $V_{gs}$ on a display line and a non-display line of a pattern (WINDOW) of high brightness.

<Description of Embodiment>

Subsequently, an embodiment of the present disclosure will be described. As can be seen from the above description, the crosstalk which causes deterioration of uniformity occurs due to the current intensively flowing through the power supplying line 32 when the signal voltage $V_{sig}$ is written by the writing transistor 23. Thus, a peak current flowing through the drive transistor 22 connected to one power supplying line 32 for each pixel 20 may be dispersed between the pixels 20. A technology of the present disclosure is provided in view of this point.

The embodiment of the present disclosure adopts a configuration in which transistors having a transistor size, that is, W (channel width)/L (channel length) different from each other are included, among the writing transistors 23 connected to one scanning line 31 for each pixel 20. Here, the fact that the writing transistors 23 connected to one scanning line 31 for each pixel 20 includes transistors having different sizes from each other means that the sizes of the writing transistors 23 connected to one scanning line 31 are not uniform.

Thus, the writing transistors 23 connected to one scanning line 31 include transistors having the same size and transistors having different sizes from each other. Here, "the same size" means that the size is substantially the same, in addition to that the size is exactly the same, and the presence of various variations occurring in the design or in the manufacture is acceptable. That is, a difference in size occurring due to various variations in the design or the manufacturing is not included in concept of the different size in the present disclosure. Regularity with regard to arrangement of the transistors having different sizes from each other does not matter in one pixel row (line).

Figure 7A:
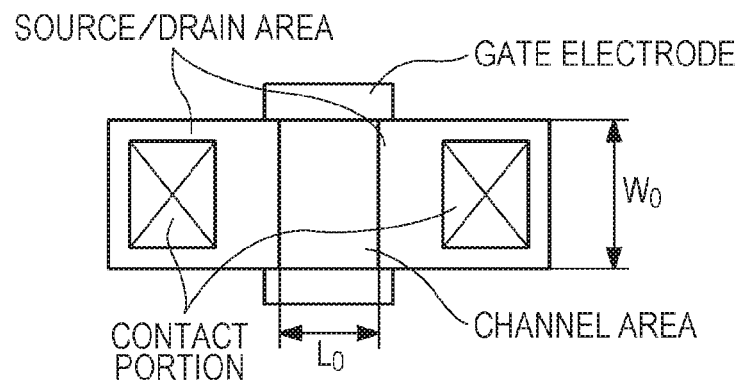
FIG. 7A is a plan view illustrating an example of a configuration of a writing transistor, and particularly illustrates a configuration of a transistor that serves as a reference.
Figure 7B:
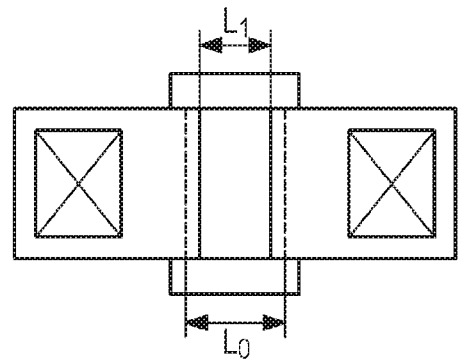
FIG. 7B is a plan view illustrating an example of a configuration of a writing transistor, and particularly illustrates a configuration of a transistor in which an L length is changed.
Figure 7C:
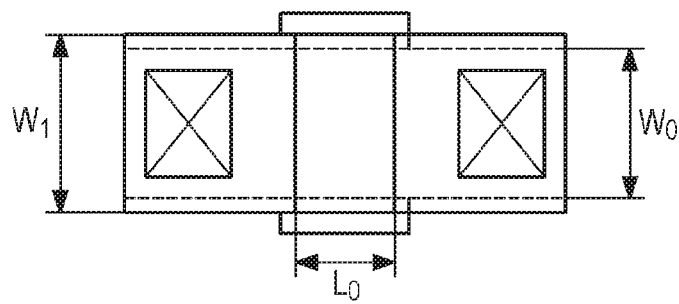
FIG. 7C is a plan view illustrating an example of a configuration of a writing transistor, and particularly illustrates a configuration of a transistor in which a W length is changed.
Figure 7D:
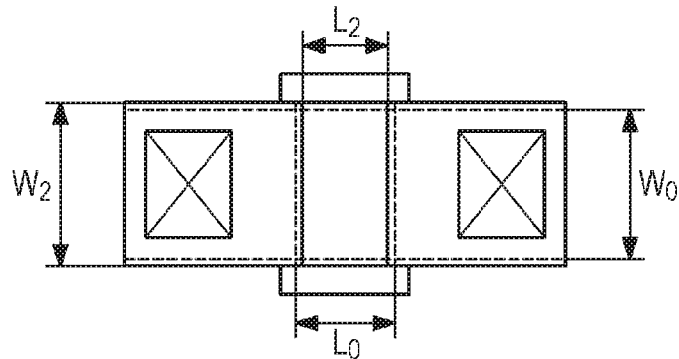
FIG. 7D is a plan view illustrating an example of a configuration of a writing transistor, and particularly illustrates a configuration of a transistor in which an L length and a W length are changed together.

When the size of the writing transistor 23 is changed, an L length, a W length, or both the L length and the W length may be changed. Specifically, when an L length of a transistor which is a reference is referred to as $L_0$ and a W length is referred to as $W_0$ as illustrated in FIG. 7A, the L length is set to $L_1$ shorter than the reference $L_0$ as illustrated in FIG. 7B, or the L length is set to $W_1$ longer than the reference $W_0$ as illustrated in FIG. 7C. Alternatively, the L length is set to $L_2$ shorter than the reference $L_0$, and the W length is set to $W_2$ longer than the reference $W_0$ as illustrated in FIG. 7D.

Here, if the gate-source voltage of the writing transistor 23 is referred to as $V_{gs\_ws}$ and the threshold voltage is referred to as $V_{th\_ws}$ the drain-source current $I_{ds\_ws}$ of the writing transistor 23 is represented by the following equation.

$$I_{ds\_ws}=k(V_{gs\_ws}-V_{th\_ws})^2$$

k is an integer which is determined by a device structure, temperature, and a voltage, and is a value approximately proportional to (W/L). Thus, when a bias voltage is the same, the wider the W length is, or the shorter the L length is, the larger the drain-source current $I_{ds\_ws}$ of the writing transistor 23 is, and thus it is possible to increase a drive capability of a transistor.

In the present disclosure, the pixel 20 may be a monochrome pixel, and may be a pixel that is unit forming a color image, that is, a unit pixel that is configured by sub-pixels of a plurality of colors. Hereinafter, a case where the pixel 20 is configured by a pixel that is unit pixel forming a color image will be uses as an example, and a specific example will be described.

Example 1

Figure 8A:
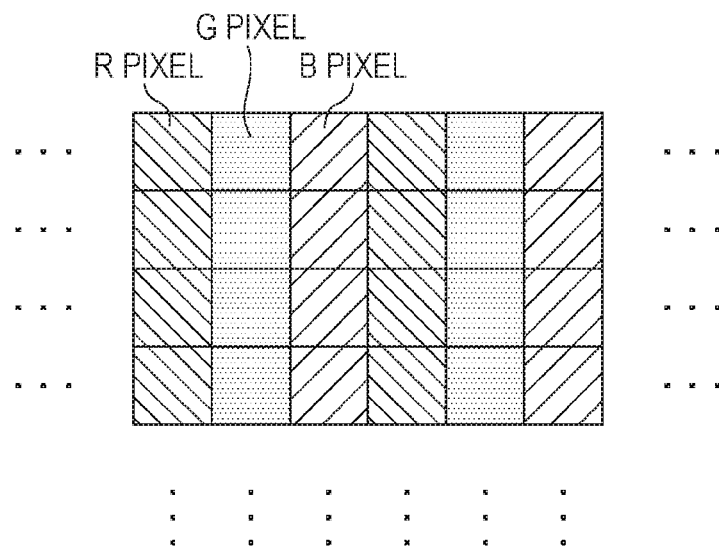
FIG. 8A is a view illustrating a color arrangement of a sub-pixel according to Example 1.

FIG. 8A is a view illustrating a color arrangement of a sub-pixel according to Example 1. In a color arrangement of Example 1, sub-pixels configuring the pixel 20 are formed of sub-pixels of three colors of red (R), green (G), and blue (B), and these sub-pixels have a vertical stripe shape in which the sub-pixels are arranged in a strip shape in column direction (vertical direction). Then, in Example 1, when the pixel 20 is configured by a pixel which is unit forming a color image, that is, configured by sub-pixels of three colors of RGB, the size (W/L) of the writing transistor 23 connected to one scanning line 31 for each sub-pixel is set so as to be changed by a color unit.

Figure 9:
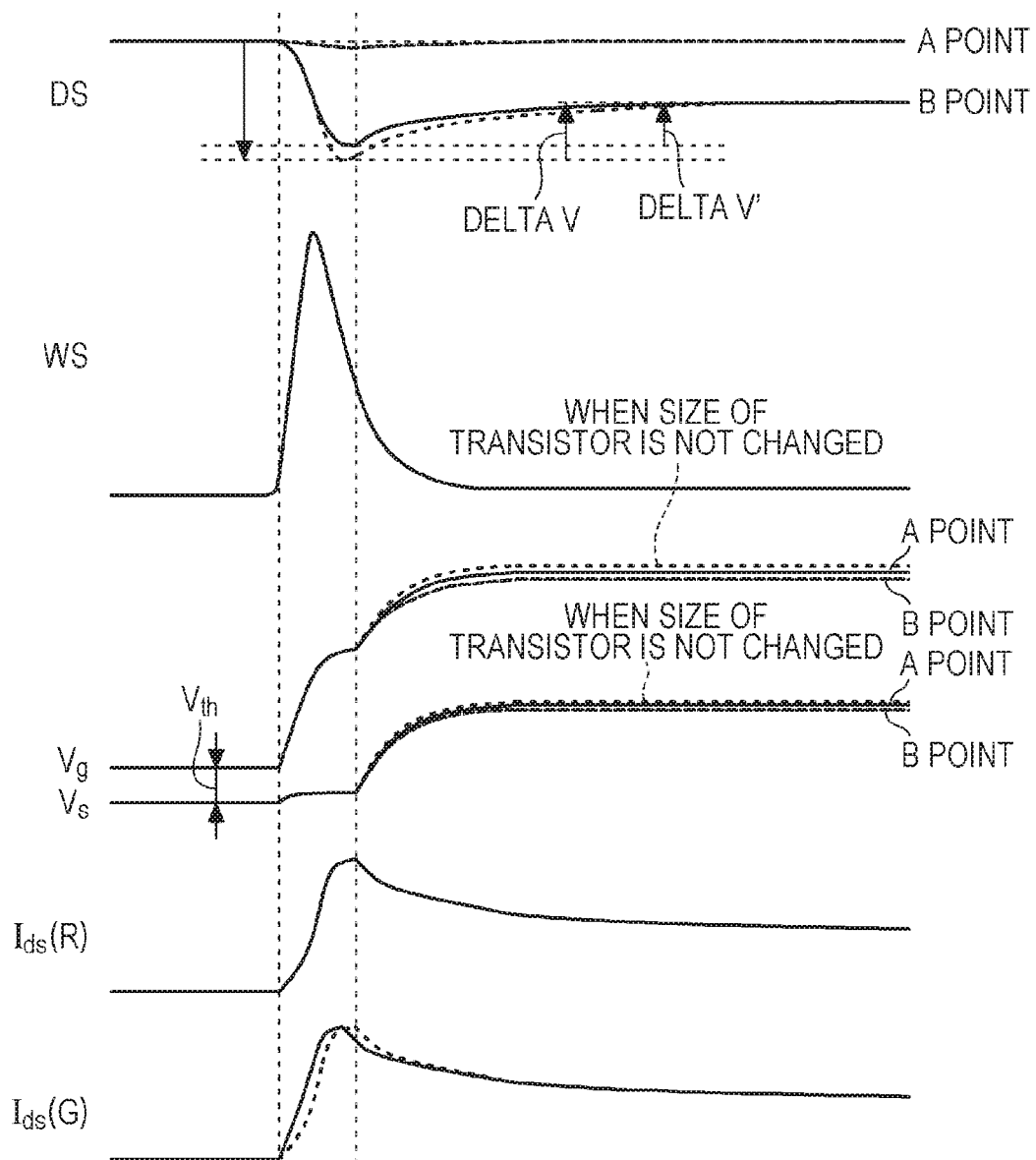
FIG. 9 is a waveform diagram illustrating drive waveforms at the time of signal writing performed by a writing transistor, in a case of Example 1.

By changing the size (W/L) of the writing transistor 23, the drive capability of the transistor is changed, and thus it is possible to displace writing timing of the writing transistor 23 by a color unit of the sub-pixel. FIG. 9 illustrates drive waveforms at the time of signal writing performed by the writing transistor 23, in a case of Example 1. As an example, Example 1 adopts a configuration in which the size (W/L) of the writing transistor 23 of a sub-pixel of G is set to be greater than the size of the writing transistor 23 of a sub-pixel of R.

If the size (W/L) of the transistor is large, a drive capability increases as a transistor, and thus a writing speed of the writing transistor 23 is increased. Thus, the peak of a current of the sub-pixel of G also becomes faster than the peak of a current of the sub-pixel of R. When the size of the writing transistor 23 is not changed for each color, a peak position of a current of the sub-pixel of G is the same as a peak position of a current of the sub-pixel of R as illustrated by dotted line in FIG. 9, and thus a large current instantaneously flows through the power supplying line 32.

In contrast to this, in Example 1 in which the size of the writing transistor 23 is changed for each color, a peak position of a current flowing through the drive transistor 22 connected to one power supplying line 32 for each sub-pixel can be dispersed between sub-pixels of each color. Accordingly, an absolute value of a current instantaneously flowing through the power supplying line 32 can be reduced, and thus it is possible to decrease a voltage drop on the power supplying line 32. Then, an amount of voltage increase delta V' of a potential on the power supplying line 32 from when the writing scanning signal WS enters an inactive state until becoming normal light emission state, is smaller than an amount of voltage increase delta V when the size of the writing transistor 23 is not changed for each color. As a result, at the time of signal writing performed by the writing transistor 23, it is possible to reduce crosstalk caused by a current instantaneously flowing through the power supplying line 32.

Meanwhile, Example 1 has a configuration in which the sizes of the writing transistors 23 of the sub-pixel of G and the sub-pixel of R are changed, but in a case of a vertical stripe arrangement of the sub-pixel of three colors of RGB, it is possible to configure to change a size of only one color, or to change all three colors, that is, the size of the writing transistor 23 for each color.

Example 2

Figure 8B:
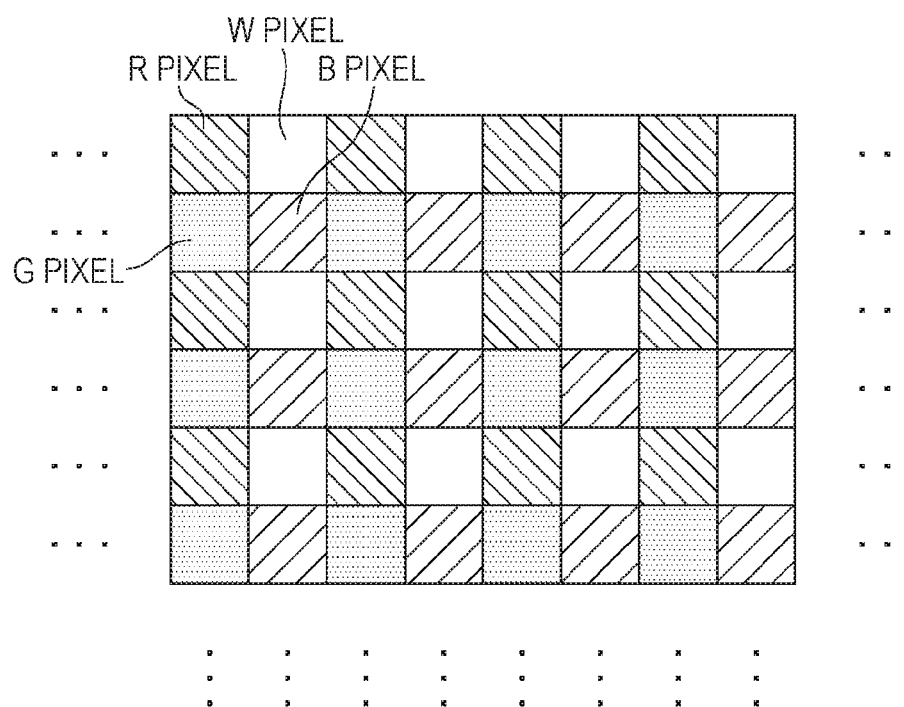
FIG. 8B is a view illustrating a color arrangement of a sub-pixel according to Example 2.

FIG. 8B is a view illustrating a color arrangement of a sub-pixel according to Example 2. In the color arrangement of Example 2, the sub-pixels configuring the pixel 20 are configured by sub-pixels of four colors including a white (W) sub-pixel in addition to the sub-pixel of RGB, and these sub-pixels are formed of a field shape arrangement which is arranged in a field shape. Then, also in Example 2, size (W/L) of the writing transistor 23 connected to one scanning line 31 for each pixel 20 is set so as to be changed by a color unit, in the same manner as in Example 1. Accordingly, also in Example 2, it is possible to obtain the same actions and effects as in Example 1, that is, at the time of signal writing performed by the writing transistor 23, a current instantaneously flowing through the power supplying line 32 can be reduced, and thus it is possible to reduce crosstalk caused by the instantaneous current.

When the size of the writing transistor 23 is changed by a color unit, with regard to all sub-pixels of four colors of RGBW, that is, it is most effective to configure such that the size of the writing transistor 23 is changed for each color, but the present disclosure is not limited to this. For example, the sub-pixel may be configured such that the size of the writing transistor 23 is changed for every two colors as a pair, alternatively, may be configured such that the size of the writing transistor 23 of a sub-pixel of only one color is changed. As an example, the size of the writing transistor 23 of a sub-pixel of W is set to be smaller than the size of the writing transistor of a sub-pixel of at least another color. Meanwhile, the color arrangement illustrated in FIG. 7B is an example, and is not limited to this, and may be a vertical stripe arrangement of sub-pixels of four colors of RGBW.

The size of the writing transistor 23 is set so as to be different sizes according to a current value necessary at the time of signal writing performed by the writing transistor 23. At this time, it is preferable that the size is set so as to be increased in a sequence of small current value necessary at the time of signal writing performed by the writing transistor 23, with regard to the size of the writing transistor 23 of sub-pixels of each color. As an example, in a case of a vertical stripe arrangement of sub-pixels of four colors of RGBW, the size is set so as to be increased in a sequence of a sub-pixel of W, a sub-pixel of R, a sub-pixel of G, and a sub-pixel of B, with regard to the size (W/L) of the writing transistor 23 of each sub-pixel of RGBW.

<Modification Example>

In the above-described embodiment, a case where the light emitting unit of the unit pixel 20 is applied to an organic EL display device which is configured with the organic EL element 21 is used as an example, but the present disclosure is not limited to an application to the organic EL display device. That is, the technology of the present disclosure can be applied to the entire display device which is configured to have a writing transistor in which the unit pixel 20 writes a signal, such as a display device in which the light emitting unit of the unit pixel 20 is configured by a current drive type electro-optical element, such as an inorganic EL element, an LED element, or a semiconductor laser element, or a liquid crystal display device.

In addition, in the above-described embodiment, a circuit configuration of 2Tr2C is exemplified as a drive circuit that drives the organic EL element 21, but the present disclosure is not limited to the circuit configuration of 2Tr2C. For example, the auxiliary capacitor 25 is just for assisting an equivalent capacitance of the organic EL element 21, and is not a necessary configuration element. Thus, when an equivalent capacitance of the organic EL element 21 can be sufficiently secured, it is also possible to adopt a circuit configuration of 2Tr1C except for the auxiliary capacitor 25.

Furthermore, it may be possible to increase the number of transistors if necessary. As an example, it is possible to have not only a configuration in which the reference voltage $V_{ofs}$ is incorporated by the writing transistor 23 from the signal line 33, but also a configuration in which a dedicated switching transistor is provided, and the reference voltage $V_{ofs}$ is incorporated by the switching transistor. In addition, it is possible to have a configuration in which switching transistors are connected in series to the drive transistor 22, and light emission/non-light-emission of the organic EL element 21 is controlled by the switching transistor.

<Electronic Apparatus>

The display device of the present disclosure described above can be used as a display unit (display device) of an electronic apparatus of all areas in which a video signal which is input to the electronic apparatus, or a video signal generated in the electronic apparatus is displayed as an image or a video. As an example, the display device of the present disclosure can be used as a display unit of an electronic apparatus for example, a television set, a digital camera, a node type personal computer, a portable terminal device such as a smart phone or a telephone, a video camera, and a video camera.

In this way, the display device of the present disclosure is used as a display unit of electronic apparatus of all areas, and thereby it is possible to increase display quality of various electronic apparatuses. That is, as can be seen from the embodiments described above, according to the display device of the present disclosure, at the time of signal writing performed by a writing transistor, it is possible to reduce crosstalk caused by a current instantaneously flowing through a power supplying line. Thus, the display device of the present disclosure is used for the various electronic apparatuses, it is possible to increase image quality.

The display device of the present disclosure includes a device having a module shape with a sealed configuration. As an example, a display module formed by attaching a counter unit such as a transparent glass to a pixel array unit corresponds to the device. Meanwhile, the display module may include a circuit unit, a flexible printed circuit (FPC), or the like which inputs and outputs a signal or the like to a pixel array unit from the outside. Hereinafter, as a specific example of an electronic apparatus using the display device of the present disclosure, a television set is exemplified. However, a specific example exemplified herein is just an example, and the present disclosure is not limited to this.

<Specific Example>

Figure 10:
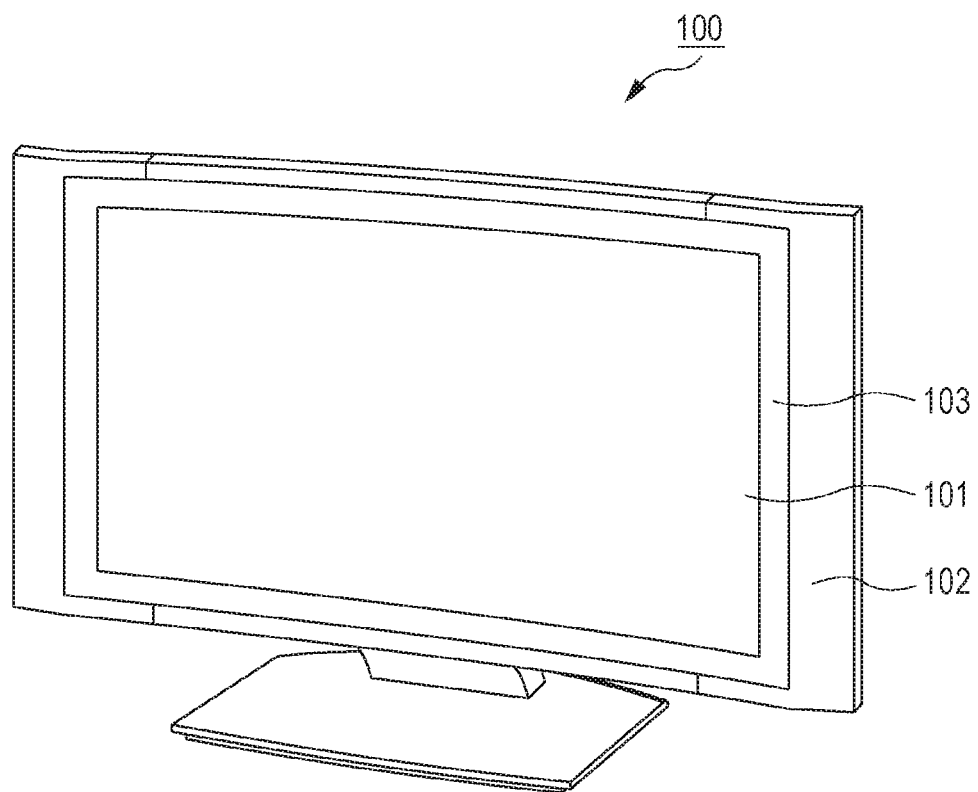
FIG. 10 is a perspective view illustrating an appearance of a television set that is an example of an electronic apparatus according to the present disclosure.

FIG. 10 is a perspective view illustrating an appearance of a television set that is an example of an electronic apparatus according to the present disclosure. A television set 100 according to a specific example includes a video display screen unit 101 which is configured by a front panel 102, a filter glass 103, or the like. In the television set 100, the display device of the present disclosure can be used as the video display screen unit 101.

That is, the television set 100 according to a specific example is manufactured by using the display device of the present disclosure as the video display screen unit 101. In this way, in the television set 100, the display device of the present disclosure is used as the video display screen unit 101, and thereby it is possible to reduce crosstalk caused by a current instantaneously flowing through a power supplying line at the time of signal writing, and thus image quality is increased.

Meanwhile, the present disclosure can include at least the following configurations.

(1) A display unit comprising:

a plurality of sub-pixels, each including a light emitting element, a capacitor, a first transistor configured to write a signal potential to the capacitor, and a second transistor configured to provide a drive current to the light emitting element based on a voltage stored in the capacitor, wherein the first transistor of each of the plurality of sub-pixels has a width-to-length ratio W/L, and a width to length ratio $W_1/L_1$ of a first sub-pixel of the plurality of sub-pixels is different than a width-to-length ratio $W_2/L_2$ of a second sub-pixel of the plurality of sub-pixels.

(2) The display unit of 1, wherein the plurality of sub-pixels are arranged in a matrix of rows and columns, and the first sub-pixel and the second sub-pixel are located in a same row as one another.

(3) The display unit of any one of (1) and (2), further comprising:

scanning lines, each being connected to respective gate electrodes of the first transistors of some of the plurality of sub-pixels, wherein the first transistor of the first sub-pixel and the first transistor of the second sub-pixel are connected to the same scanning line as one another.

(4) The display unit of any one of (1) through (3), wherein the first sub-pixel emits light of a first color and the second sub-pixel emits light of a second color.

(5) The display unit of any one of (1) through (4), wherein the first color is red and the second color is green.

(6) The display unit of any one of (1) through (5), wherein the first color is white and the second color is green.

(7) The display unit of any one of (1) through (6), wherein a width-to-length ratio of each of the plurality of sub-pixels that emits light of the first-color equals $W_1/L_1$, and a width-to-length ratio of each of the plurality of sub-pixels that emits light of the second-color equals $W_2/L_2$.

(8) The display unit of any one of (1) through (7), wherein the plurality of sub-pixels each emit light in one of N colors, where N>1, each of the N colors has a different width-to-length ratio $W_i/L_i$ corresponding thereto, where i={1, 2, . . . , N}, and for each of the N colors, a width-to-length ratio of each of the plurality of sub-pixels that emits light of the i-th color equals $W_i/L_i$.

(9) The display unit of any one of (1) through (8), wherein the N colors include white, red, green, and blue, a width-to-length ratio $W_1/L_1$ corresponds to white, a width-to-length ratio $W_2/L_2$ corresponds to red, a width-to-length ratio $W_3/L_3$ corresponds to green, a width-to-length ratio $W_4/L_4$ corresponds to blue, and $W_1/L_1 < W_2/L_2 < W_3/L_3 < W_4/L_4$.

(10) The display unit of any one of (1) through (8), wherein the N colors include red, green, and blue, a width-to-length ratio $W_1/L_1$ corresponds to red, a width-to-length ratio $W_2/L_2$ corresponds to green, and a width-to-length ratio $W_3/L_3$ corresponds to blue, and $W_1/L_1 < W_2/L_2 < W_3/L_3$.

(11) An electronic apparatus comprising:

a display unit that includes a plurality of sub-pixels, each including a light emitting element, a capacitor, a first transistor configured to write a signal potential to the capacitor, and a second transistor configured to provide a drive current to the light emitting element based on a voltage stored in the capacitor, wherein the first transistor of each of the plurality of sub-pixels has a width-to-length ratio W/L, and a width to length ratio $W_1/L_1$ of a first sub-pixel of the plurality of sub-pixels is different than a width-to-length ratio $W_2/L_2$ of a second sub-pixel of the plurality of sub-pixels.

(12) The electronic apparatus of (11), wherein the plurality of sub-pixels are arranged in a matrix of rows and columns, and the first sub-pixel and the second sub-pixel are located in a same row as one another.

(13) The electronic apparatus of anyone of (11) and (12), further comprising:

scanning lines, each being connected to respective gate electrodes of the first transistors of some of the plurality of sub-pixels, wherein the first transistor of the first sub-pixel and the first transistor of the second sub-pixel are connected to the same scanning line as one another.

(14) The electronic apparatus of any one of (11) through (13), wherein the first sub-pixel emits light of a first color and the second sub-pixel emits light of a second color.

(15) The electronic apparatus of any one of (11) through (14), wherein the first color is red and the second color is green.

(16) The electronic apparatus of any one of (11) through (15), wherein the first color is white and the second color is green.

(17) The electronic apparatus of any one of (11) through (16), wherein a width-to-length ratio of each of the plurality of sub-pixels that emits light of the first-color equals $W_1/L_1$, and a width-to-length ratio of each of the plurality of sub-pixels that emits light of the second-color equals $W_2/L_2$.

(18) The electronic apparatus of any one of (11) through (17), wherein the plurality of sub-pixels each emit light in one of N colors, where N>1, each of the N colors has a different width-to-length ratio $W_i/L_i$ corresponding thereto, where i={1, 2, . . . , N}, and for each of the N colors, a width-to-length ratio of each of the plurality of sub-pixels that emits light of the i-th color equals $W_i/L_i$.

(19) The electronic apparatus of any one of (11) through (18), wherein the N colors include white, red, green, and blue, a width-to-length ratio $W_1/L_1$ corresponds to white, a width-to-length ratio $W_2/L_2$ corresponds to red, a width-to-length ratio $W_3/L_3$ corresponds to green, a width-to-length ratio $W_4/L_4$ corresponds to blue, and $W_1/L_1 < W_2/L_2 < W_3/L_3 < W_4/L_4$.

(20) The electronic apparatus of any one of (11) through (18), wherein the N colors include red, green, and blue, a width-to-length ratio $W_1/L_1$ corresponds to red, a width-to-length ratio $W_2/L_2$ corresponds to green, and a width-to-length ratio $W_3/L_3$ corresponds to blue, and $W_1/L_1 < W_2/L_2 < W_3/L_3$.

(21) A display device including:

unit pixels which include light emitting units and are arranged in a matrix, in which the unit pixel includes a writing transistor that writes a signal according to a scanning signal which is supplied via a scanning line arranged in each pixel row, and in which the writing transistors connected to one scanning line for each unit pixel include transistors having different size from each other.

(22) The display device described in (21), in which the unit pixel is configured by sub-pixels of a plurality of colors, and in which the sizes of the writing transistors connected to the one scanning line for each unit pixel are different by color unit of the sub-pixels.

(23) The display device described in (22), in which the unit pixel includes a white sub-pixel, and in which the size of the writing transistor of the white sub-pixel is set to be smaller than a size of a writing transistor of a sub-pixel of at least one color.

(24) The display device described in (22) or (23), in which the sizes of the writing transistors of sub-pixels of each color that configure the unit pixel are set to sizes different from each other according to a current value necessary at the time of signal writing.

(25) The display device described in (24), in which the sizes of the writing transistors of sub-pixels of each color that configure the unit pixel are set so as to be increased in a sequence of a small current value necessary at the time of signal writing.

(26) The display device described in (25), in which the unit pixel includes the red sub-pixel, the green sub-pixel, and the blue sub-pixel, in addition to the white sub-pixel, and in which the sizes of the writing transistors of each sub-pixel are set to be increased in a sequence of a white sub-pixel, a red sub-pixel, a green sub-pixel, and a blue sub-pixel.

(27) The display device described in any one of (21) to (26), in which the unit pixel includes a drive transistor that drives the light emitting unit based on a signal which is written by the writing transistor, and includes a correction function of correcting variation of a drive current caused by variation of characteristics of the drive transistor.

(28) The display device described in (27), in which the correction function is a function of correcting the variation of the drive current caused by variation of a threshold voltage of the drive transistor.

(29) The display device described in (27) or (28), in which the correction function is a function of correcting the variation of the drive current caused by variation of mobility of a semiconductor thin film that configures a channel of the drive transistor.

(30) The display device described in any one of (21) to (29), in which the light emitting unit of the unit pixel is configured by a current drive type electro-optical element.

(31) The display device described in (30), in which the current drive type electro-optical element is an organic electroluminescence element.

(32) An electronic apparatus including:

a display device that includes unit pixels which include light emitting units and are arranged in a matrix, in which the unit pixel includes a writing transistor that writes a signal according to a scanning signal which is supplied via a scanning line arranged in each pixel row, and in which the writing transistors connected to one scanning line for each unit pixel include transistors having different size from each other.

It should be understood by those skilled in the art that various modifications, combinations, sub-combinations and alterations may occur depending on design requirements and other factors insofar as they are within the scope of the appended claims or the equivalents thereof.

In the appended claims, ratios of channel width to channel length are referred to using the labels $W_i/L_i$, where i is an index distinguishing different ratios from one another. For example, a first width to length ratio may be labeled $W_1/L_1$, while a second width to length ratio that is different from the first width to length ratio may be labeled $W_2/L_2$. However, it will be understood that the index merely distinguishes the different ratios as a whole from one another, but does not necessarily imply anything about the specific channel widths and/or channel lengths of the ratios. Thus, two transistors may have the same width to length ratio as each other, and yet have different channel widths or channel lengths from one another. Similarly, two transistor may have different width to length ratios, and yet have the same channel widths or the same channel lengths as one another. Thus, for example, if a first transistor has the first ratio $W_1/L_1$ and a second transistor also has the first ratio $W_1/L_1$, that does not imply that the channel width or the channel length of the two transistors must necessarily be the same-it only implies that the ratios for the two transistors are the same. As another example, if a first transistor has the first ratio $W_1/L_1$ and a second transistor has the $W_2/L_2$, that does not imply that the channel widths or channel lengths of the two transistors cannot be the same-it only implies that the ratios for the two transistors are different.

REFERENCE SIGNS LIST 10 organic EL display device
20 unit pixel (pixel circuit)
21 organic EL element
22 drive transistor
23 writing transistor
24 storage capacitor
25 auxiliary capacitor
30 pixel array unit
31($31_1$ to $31_m$) scanning line
32($32_1$ to $32_m$) power supplying line
33($33_1$ to $33_n$) signal line
34 common power supply line
40 writing scanning unit
50 power supplying scanning unit
60 signal output unit
70 display panel

The invention claimed is:

1. A display device comprising:
a plurality of pixels, respective ones of the plurality of pixels including four sub-pixels consisting of an R sub-pixel, a G sub-pixel, a B sub-pixel, and a W sub-pixel, respective ones of the four sub-pixels including a light emitting element, a capacitor, a first transistor configured to provide a potential to the capacitor, and a second transistor configured to provide a drive current to the light emitting element based on a voltage stored in the capacitor;
a plurality of scanning lines configured to propagate a control voltage, respective ones of the plurality of scanning lines connected to control terminals of the first transistors of the four sub-pixels; and
a plurality of voltage supply lines configured to propagate a predetermined voltage, respective ones of the plurality of voltage supply lines connected to first terminals of the second transistors of the four sub-pixels,
wherein the first transistors of each of the four sub-pixels are dimensioned such that either:
a channel length of the first transistor of a first sub-pixel of the four sub-pixels and of the first transistor of a second sub-pixel of the four sub-pixels is greater than a channel length of the first transistor of a third sub-pixel of the four sub-pixels and of the first transistor of a fourth sub-pixel of the four sub-pixels, or
a channel width of the first transistor of the first sub-pixel and of the first transistor of the second sub-pixel is greater than a channel width of the first transistor of the third sub-pixel and of the first transistor of the fourth sub-pixel.

2. A display device comprising:
a plurality of pixels, respective ones of the plurality of pixels including four sub-pixels consisting of an R sub-pixel, a G sub-pixel, a B sub-pixel, and a W sub-pixel, respective ones of the four sub-pixels including a light emitting element, a capacitor, a first transistor configured to provide a potential to the capacitor, and a second transistor configured to provide a drive current to the light emitting element based on a voltage stored in the capacitor;
a plurality of scanning lines configured to propagate a control voltage, respective ones of the plurality of scanning lines connected to control terminals of the first transistors of the four sub-pixels; and
a plurality of voltage supply lines configured to propagate a predetermined voltage, respective ones of the plurality of voltage supply lines connected to first terminals of the second transistors of the four sub-pixels,
wherein
a width to length ratio $W_1/L_1$ of the first transistor of a first sub-pixel of the four sub-pixels and of the first transistor of a second sub-pixel of the four sub-pixels is different than a width-to-length ratio $W_2/L_2$ of the first transistor of a third sub-pixel of the four sub-pixels and of the first transistor of a fourth sub-pixel of the four sub-pixels.

3. The display device according to claim 1, wherein respective ones of the plurality of scanning lines extend along a first direction.

4. The display device according to claim 3, wherein respective ones of the plurality of voltage supply lines extend along the first direction.

5. The display device according to claim 4, further comprising a plurality of first lines, wherein respective ones of the plurality of first lines extend along a second direction.

6. The display device according to claim 5, wherein, in respective ones of the four sub-pixels, a first terminal of the first transistor is connected to one of the plurality of first lines, and a second terminal of the first transistor is connected to a first electrode of the capacitor.

7. The display device according to claim 6, wherein the plurality of first lines is a plurality of signal lines.

8. The display device according to claim 7, wherein the plurality of first lines are configured to supply a video signal.

9. The display device according to claim 1, wherein, in respective ones of the four sub-pixels, a second terminal of the second transistor is connected to an anode electrode of the light emitting element.

10. The display device according to claim 1, wherein the first transistor is in a conductive state during a correction period to detect a current through the second transistor.

11. The display device according to claim 1, wherein the first transistor is a sampling transistor.

12. The display device according to claim 1, wherein the second transistor is a driving transistor.

13. The display device according to claim 2, wherein respective ones of the plurality of scanning lines extend along a first direction.

14. The display device according to claim 13, wherein respective ones of the plurality of voltage supply lines extend along the first direction.

15. The display device according to claim 14, further comprising a plurality of first lines, wherein respective ones of the plurality of first lines extend along a second direction.

16. The display device according to claim 15, wherein, in respective ones of the four sub-pixels, a first terminal of the first transistor is connected to one of the plurality of first lines, and a second terminal of the first transistor is connected to a first electrode of the capacitor.

17. The display device according to claim 16, wherein the plurality of first lines is a plurality of signal lines.

18. The display device according to claim 17, wherein the plurality of first lines are configured to supply a video signal.

19. The display device according to claim 2, wherein, in respective ones of the four sub-pixels, a second terminal of the second transistor is connected to an anode electrode of the light emitting element.

20. The display device according to claim 2, wherein the first transistor is in a conductive state during a correction period to detect a current through the second transistor.

21. The display device according to claim 2, wherein the first transistor is a sampling transistor.

22. The display device according to claim 2, wherein the second transistor is a driving transistor.

* * * * *